US012618893B2

(12) United States Patent
Jeon et al.

(10) Patent No.: US 12,618,893 B2
(45) Date of Patent: May 5, 2026

(54) APPARATUS AND METHOD OF MEASURING RELIABILITY FOR FLASH MEMORY MATERIAL THROUGH A CURRENT MEASUREMENT

(71) Applicant: SK hynix Inc., Icheon-si (KR)

(72) Inventors: Nam Cheol Jeon, Icheon-si (KR); Hea Jong Yang, Icheon-si (KR); Tae Un Youn, Icheon-si (KR)

(73) Assignee: SK hynic Inc., Icheon-si (KR)

( * ) Notice: Subject to any disclaimer, the term of this patent is extended or adjusted under 35 U.S.C. 154(b) by 228 days.

(21) Appl. No.: 18/500,841

(22) Filed: Nov. 2, 2023

(65) Prior Publication Data

US 2024/0159818 A1 May 16, 2024

(30) Foreign Application Priority Data

Nov. 11, 2022 (KR) ........................ 10-2022-0150415

(51) Int. Cl.
G01R 31/26 (2020.01)
G11C 29/12 (2006.01)

(52) U.S. Cl.
CPC .... G01R 31/2648 (2013.01); G11C 29/12005 (2013.01); *G11C 2029/1202* (2013.01)

(58) Field of Classification Search
CPC .......... G01R 31/2648; G11C 29/12005; G11C 2029/1202
See application file for complete search history.

(56) References Cited

U.S. PATENT DOCUMENTS

| | | | | |
|---|---|---|---|---|
| 6,339,339 | B2 * | 1/2002 | Maeda | G01R 31/2621 |
| | | | | 702/170 |
| 6,602,729 | B2 * | 8/2003 | Lin | G01N 27/92 |
| | | | | 257/E21.531 |
| 6,791,891 | B1 * | 9/2004 | Peng | G11C 29/50 |
| | | | | 365/201 |
| 6,808,945 | B1 | 10/2004 | Wang et al. | |
| 7,920,428 | B2 * | 4/2011 | Yamada | G11C 29/50004 |
| | | | | 365/185.21 |

FOREIGN PATENT DOCUMENTS

KR        1020170086390 A        7/2017

* cited by examiner

*Primary Examiner* — Vanthu T Nguyen
(74) *Attorney, Agent, or Firm* — WILLIAM PARK AND ASSOCIATES LTD.

(57) ABSTRACT

A reliability measuring apparatus includes an oxide-nitride-oxide-alumina (ONOA) current measuring circuit configured to measure an ONOA current by applying an ONOA current measuring voltage to a selected word line coupled to a selected memory cell in a flash memory and a reliability indicator generator configured to a reliability indicator using the ONOA current measured through the measuring circuit.

15 Claims, 6 Drawing Sheets

110

※ ONOA : Oxide-Nitride-Oxide-Alumina

TOX : Tunnel Oxide

CTN : Charge Trap Nitride

BOX : Blocking Oxide

APPARATUS AND METHOD OF MEASURING RELIABILITY FOR FLASH MEMORY MATERIAL THROUGH A CURRENT MEASUREMENT

CROSS-REFERENCES TO RELATED APPLICATION

The present application claims priority under 35 U.S.C. § 119(a) to Korean Patent Application Number 10-2022-0150415, filed on Nov. 11, 2022, in the Korean Intellectual Property Office, which is incorporated herein by reference in its entirety.

BACKGROUND

1. Technical Field

Various embodiments may generally relate to a reliability measuring technology for a flash memory, and more particularly, to an apparatus and method of measuring reliability for a flash memory material capable of predicting reliability characteristics of a flash memory material by measuring current flowing via a tunneling insulator and performing material management during a flash memory manufacturing process.

2. Related Art

In general, semiconductor memory apparatuses exhibit a bathtub curve characteristic including an early failure period, an intrinsic failure period and a wear-out failure period.

The early failure period refers to a period that many unexpected defects occur. The intrinsic failure period refers to a period that random defects of a semiconductor itself occur after the early failure period. The wear-out failure period refers to a period that an intrinsic wear mechanism starts and a failure rate increases exponentially.

Accordingly, a semiconductor reliability evaluation which measures reliability indicators to ensure reliability is performed in a semiconductor manufacturing process. The typical examples of the reliability indictors are electromigration (EM) which characterizes the quality of metals with high current and temperature, hot carrier injection (HCI) that carriers of a channel region of a device receive high energy and inject into an insulating layer to change a threshold voltage VT of the device, time dependent dielectric breakdown (TDDB) that the carries injected into the insulating layer short-circuit a substrate and a gate of the device, bias temperature instability (BTI) that a threshold voltage VT of a device is shifted when 0, 1, 0, 1 . . . are successively repeated, endurance, retention, disturbance, interference, and a tunneling oxide (TOX) nitrogen gradient of a memory cell, and the like.

However, there is a limit in that the reliability-related items such as the endurance, retention, disturbance, interference, or the TOX nitrogen gradient can be measured only in very few materials during the semiconductor mass production process due to limitations of a measuring time and equipment.

SUMMARY

In an embodiment of the present disclosure, a flash memory material reliability measuring apparatus through current measurement may include: an oxide-nitride-oxide-alumina (ONOA) current measuring circuit configured to measure an ONOA current by applying an ONOA current measuring voltage to a selected word line coupled to a selected memory cell in a flash memory; and a reliability indicator generator configured to generate a reliability indicator using the ONOA current measured through the ONOA current measuring circuit.

In an embodiment of the present disclosure, a method of measuring reliability of a material of a flash memory using a flash memory material reliability measuring apparatus, which includes an Oxide-Nitride-Oxide-Alumina (ONOA) current measuring circuit, a reliability indicator generator, and a material managing circuit, the method may include: the ONOA current measuring circuit measuring an ONOA current via a tunnel insulating layer through Fowler-Nordheim (FN) tunneling by applying an ONOA current measuring voltage to a selected word line coupled to a selected memory cell of the flash memory; and the reliability indicator generator generating a reliability indicator using the ONOA current measured in the ONOA current measuring circuit.

BRIEF DESCRIPTION OF THE DRAWINGS

The above and other aspects, features and advantages of the subject matter of the present disclosure will be more clearly understood from the following detailed description taken in conjunction with the accompanying drawings, in which.

DETAILED DESCRIPTION

Figure 1:
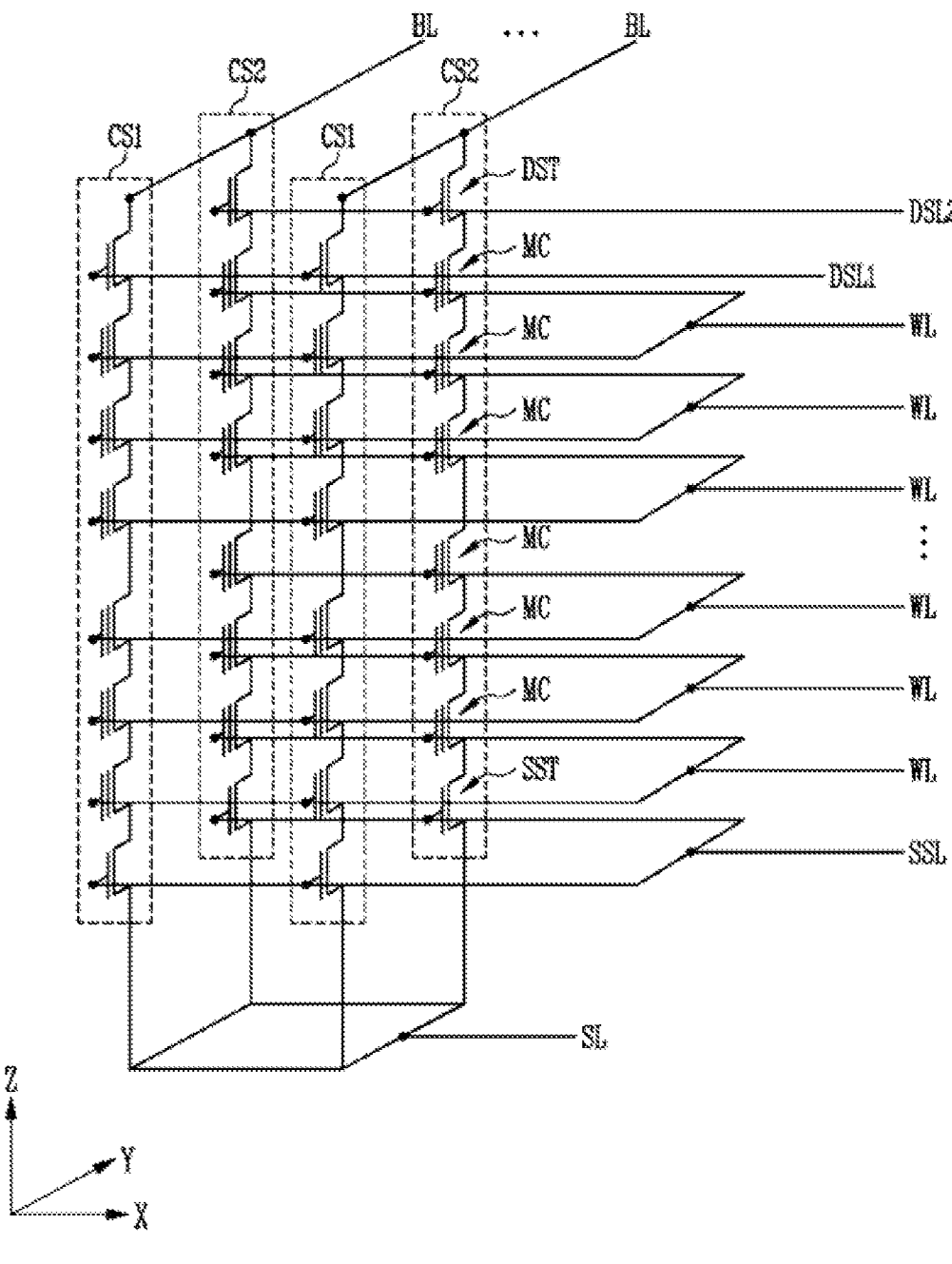
FIG. 1 is a circuit diagram illustrating a memory cell array constituting a flash memory to explain a flash memory material reliability measuring apparatus through current measurement according to an embodiment of the present disclosure.

Various embodiments of the present teachings are described in detail with reference to the accompanying drawings. The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present teachings as defined in the appended claims.

The present teachings are described herein with reference to cross-section and/or plan illustrations of idealized embodiments of the present teachings. However, embodiments of the present teachings should not be construed as limiting the present teachings. Although a few embodiments of the present teachings are shown and described, it will be appreciated by those of ordinary skill in the art that changes may be made in these embodiments without departing from the principles and spirit of the present teachings.

The present disclosure is related to a technology for measuring reliability of a flash memory. More particularly, the present disclosure is related to a flash memory material reliability measuring apparatus and method through current measurement, which detect a current flowing via a tunneling insulating layer, predict reliability characteristics of the flash memory based on the detected current, and performs material management based on the predicted reliability characteristics, during a manufacturing process of the flash memory which traps electrons in a floating gate (FG) or a charge trap nitride (CTN) layer such as NAND type semiconductor memory devices.

According to an embodiment, the technology for an apparatus and method of measuring flash memory material reliability through current measurement, which measure an Oxide-Nitride-Oxide-Alumina (ONOA) current flowing through an ONOA path by Fowler-Nordheim (FN) tunneling via a tunneling insulating layer of a flash memory, predict reliability of materials during a manufacturing process of the flash memory, and easily perform material management through screening or grading on materials of the flash memory, is provided.

Embodiments may be provided to an apparatus and method of measuring reliability for a flash memory material capable of predicting reliability characteristics of a flash memory material and performing material management by measuring an oxide-nitride-oxide-alumina (ONOA) current flowing through an ONOA path by Fowler-Nordheim (FN) tunneling in a flash memory during a flash memory manufacturing process.

The ONOA current measuring circuit may be configured to select a memory cell string including the selected memory cell, as a ONOA current measuring target, from a memory cell array of the flash memory, apply a zero (0) voltage to a selected bit line and a selected source line coupled to the selected memory cell, apply a pass voltage to unselected word lines, apply an ONOA current measuring voltage to a selected word line coupled to the selected memory cell, and measure the ONOA current.

The ONOA current measuring circuit may be configured to apply the ONOA current measuring voltage applied to the selected word line coupled to the selected memory cell through a plurality of sweep processes, each of which increases the ONOA current measuring voltage to a Fowler-Nordheim (FN) tunneling threshold voltage for one period and then maintain the ONOA current measuring voltage to the zero (0) voltage for a fixed time.

The ONOA current measuring circuit may be configured to apply the ONOA current measuring voltage to the selected word line in a second period of the ONOA current measuring voltage or at least one period among periods after the second period of the ONOA current measuring voltage, and then measure the ONOA current of the selected memory cell.

The reliability indicator generated in the reliability indicator generator may include at least one of endurance, retention, disturbance, interference, and a tunnel oxide (TOX) nitrogen gradient of the flash memory.

The reliability measuring apparatus may further include a material managing circuit configured to apply the reliability indicator generated in the reliability indicator generator to a material of the flash memory, perform management of screening on the material to exclude the material, or perform management of grading on the material to assign a grade to the material, and output a material management result according to the screening or grading.

The measuring of the ONOA current may include, by the ONOA current measuring circuit, selecting a memory cell string including the selected memory cell, as an ONOA current measuring target, from a plurality of cell strings in a memory cell array of the flash memory; applying a zero (0) voltage to a selected bit line and a selected source line coupled to the selected memory cell; applying a pass voltage to unselected word lines and applying the ONOA current measuring voltage to the selected word line; and measuring the ONOA current.

In the measuring of the ONOA current, the ONOA current measuring circuit may apply the ONOA current measuring voltage to the selected word line coupled to the selected memory cell through a plurality of sweep processes, each of which increases the ONOA current measuring voltage to a FN tunneling threshold voltage for one period and then maintains the ONOA current measuring voltage to the zero (0) voltage for a fixed time.

The measuring of the ONOA current may include, by the ONOA current measuring circuit, applying the ONOA current measuring voltage to the selected word line in a second period of the ONOA current measuring voltage or any one period after the second period of the ONOA current measuring voltage and then measure the ONOA current of the selected memory cell.

The generating of the reliability indicator generated in the reliability indicator generator may include generating at least one of endurance, retention, disturbance, interference, and a tunnel oxide (TOX) nitrogen gradient of the flash memory, as the reliability indicator, using the ONOA current.

The reliability measuring method may further include, by the material managing circuit, applying the reliability indicator generated in the reliability indicator generator to the material of the flash memory; performing management of screening on the material to exclude the material or performing management of grading on the material to assign a grade to the material; and outputting a material management result according to the screening or grading.

In an embodiment of the present disclosure, there is provided a readable recording medium in which codes, which are read by a computer to execute the material reliability measuring method of claim 7 (see below), are recorded.

According to embodiment, the flash memory material reliability measuring apparatus through current measurement may measure an ONOA current flowing through an ONOA path via a tunneling insulating layer of a flash memory through FN tunneling and predict the reliability for materials according to the measured ONOA current during the flash memory manufacturing process.

Further, material management may be easily performed through screening or grading for the flash memory materials.

These and other features, aspects, and embodiments are described in more detail below.

Herein, the FN current may refer to a FN tunneling current flowing on the ONOA path.

The ONOA current may refer to a current flowing, by the FN tunneling, from a silicon (Si) channel to a gate metal along with the ONOA path via a tunneling oxide (TOX) layer, a charge trap nitride (CTN) layer, a blocking oxide (BOX) layer, and an aluminum oxide ($Al_2O_3$) layer of a memory cell, when a zero (0) voltage is applied to a bit line BL and a source line SL of a selected memory cell, and an ONOA current measuring voltage is a word line coupled to a gate of the selected memory cell. The ONOA current may be a current flowing via the ONOA between a substrate and a gate metal in a Fowler-Nordheim (FN) tunneling manner in a program and erase operations for the selected memory cell.

A memory cell string (CS) including a memory cell as an ONOA current measuring target may refer to 'a selected memory cell string', and other memory cell strings (CSs) may refer to unselected memory cell strings.

The memory cell as the ONOA current measuring target may refer to 'a selected memory cell'.

A word line WL coupled to the selected memory cell may refer to 'a selected word line', and word lines WLs coupled to unselected memory cells may refer to 'unselected word lines'.

A bit line BL coupled to the memory cell string CS including the selected memory cell may refer to 'a selected bit line', and bit lines BLs coupled to the memory cell string CS including the unselected memory cells may refer to 'unselected bit lines'

A source line SL coupled to the memory cell string CS including the selected memory cell may refer to 'a selected source line', and source lines coupled to memory cell strings CSs including the unselected memory cells may refer to 'unselected source lines'.

Hereinafter, an embodiment of the present disclosure will be described in more detail with reference to the accompanying drawings.

FIG. 1 is a circuit diagram illustrating a memory cell array constituting a flash memory to explain a flash memory material reliability measuring apparatus through current measurement according to an embodiment of the present disclosure.

Referring to FIG. 1, the memory cell array may include a plurality of memory cell strings CS1 and CS2 coupled to a plurality of bit lines BL. The plurality of memory cell strings CS1 and CS2 coupled to the plurality of bit lines BL may be commonly coupled to a source line SL. The plurality of memory cell strings CS1 and CS2 may be coupled between the plurality of bit lines BL and the source line SL. In an example, the plurality of memory cell strings CS1 and CS2, for example, a first memory cell string CS1 and a second memory cell string CS2 may be coupled to each of the plurality of bit lines BL. The first and second memory cell strings CS1 and CS2 may be coupled between corresponding one of the plurality of bit lines BL and the source line SL.

Each of the plurality of memory cell strings CS1 and CS2 may include a source select switch SST, a plurality of memory cells MC, and a drain select transistor DST arranged between the source line SL and corresponding one of the plurality of bit lines BL. The plurality of memory cell strings CS1 and CS2 coupled to the plurality of bit lines BL may be arranged to be spaced apart from each other in a first and second directions (X and Y directions) in parallel to a substrate. The source select transistor SST, the memory cells MC, and the drain select transistor DST constituting each of the plurality of memory cell strings CS1 and CS2 may be arranged in series in a third direction (Z direction) in perpendicular to the substrate. The first to third directions (X, Y, and Z directions) may be perpendicular to each other.

In each of the plurality of memory cell strings CS1 and CS2, the source select transistor SST may control electrical connection between the plurality of memory cells MC and the source line SL. Although it is illustrated that one source select transistor SST is included in one memory cell string CS, two or more source select transistors coupled in series may be included in one memory cell string CS. In the plurality of memory cell strings CS1 and CS2, gates of the source select transistors SST may be coupled to the source select line SSL. The source select transistors SST may turn on or off according to a voltage of the source select line SSL.

In each of the plurality of memory cell strings CS1 and CS2, the plurality of memory cells MC may be coupled between the source select transistor SST and the drain select transistor DST. For example, the memory cells MC may be coupled in series between the source select transistor SST and the drain select transistor DST. Gates of the plurality of memory cells MC may be coupled to a plurality of word lines WL. A plurality of memory cells arranged in the same row among the plurality of memory cells MC of the plurality of memory cell strings CS1 and CS2 may be coupled to corresponding one of the plurality of word lines WL. The ONOA currents may flow through the memory cells MC in each of the plurality of memory cell strings CS1 and CS2 by voltages applied to the plurality of word lines WL.

In each of the plurality of memory cell strings CS1 and CS2, the drain select transistor DST may control electrical connection between the plurality of memory cells MC included in the memory cell string and corresponding one of the plurality of bit lines BL. In the plurality of memory cell strings CS1 and CS2, gates of the drain select transistors DST may be coupled to a plurality of drain select lines DSL1 and DSL2. For example, gates of the drain select transistors DST in the first memory cell strings CS1 may be coupled to a first drain select line DSL1, and gates of the drain select transistors DST in the second memory cell strings CS2 may be coupled to a second drain select line DSL2. Accordingly, the drain select transistors DST in the first memory cell strings CS1 may turn on or off according to a voltage applied to the first drain select line DSL1, and the drain select transistors DST in the second memory cell string CS2 may turn on or off according to a voltage applied to the second drain select line DSL2. When the ONOA current is measured, the memory cell strings coupled to a drain select line selected from the first and second drain select lines DSL1 and DSL2 may be selected. A memory cell string including a memory cell, which is a selected memory cell as an ONOA current measuring target, may be selected by the drain select line.

The source select line SSL, the word lines WL, and the drain select lines DSL may be extended to the first direction (X direction), and may be stacked to be spaced apart from each other in the third direction (Z direction).

Although not shown in drawings, the source select line SSL may also be divided into a first source select line and a second source select line to be coupled to the first and second memory cell strings CS1 and CS2, respectively, like the first and second drain select lines DSL1 and DSL2.

A flash memory material reliability measuring apparatus 100 according to an embodiment may be configured to select a specific memory cell from the memory cell array to measure the ONOA current, generate a reliability indicator using the measured ONOA current, and perform material management using the generated reliability indicator.

Figure 2:
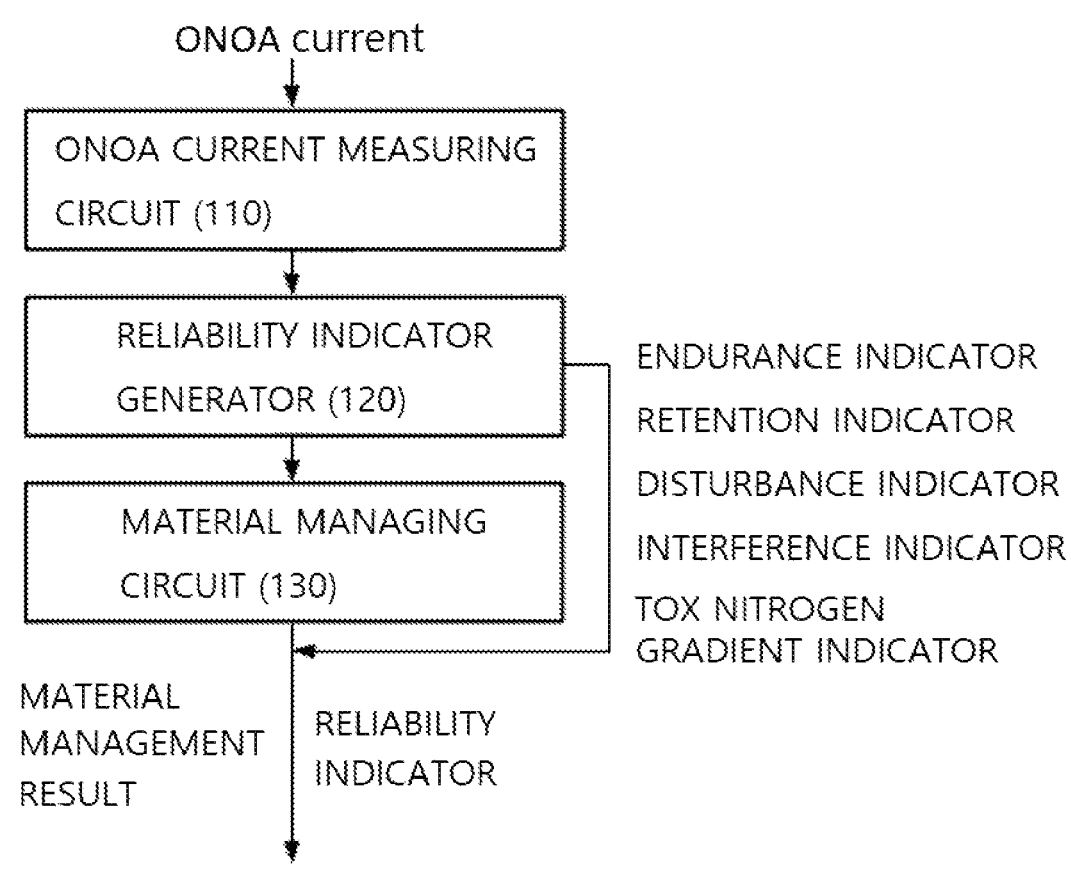
FIG. 2 is a functional block diagram illustrating a flash memory material reliability measuring apparatus through current measurement according to an embodiment of the present disclosure.
Figure 3:
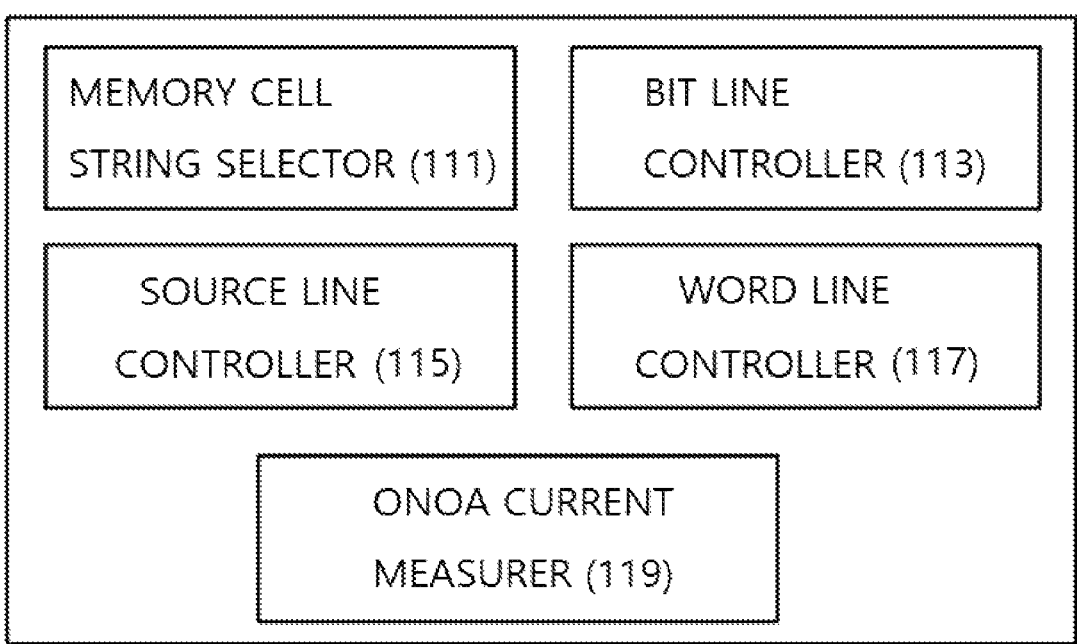
FIG. 3 is a functional block diagram illustrating an ONOA current measuring circuit in a flash memory material reliability measuring apparatus through current measurement according to an embodiment of the present disclosure.

FIG. 2 is a functional block diagram illustrating the flash memory material measuring apparatus 100 through current measurement according to an embodiment, and FIG. 3 is a functional block diagram of an ONOA current measuring circuit in the flash memory material measuring apparatus 100 through current measurement according to an embodiment.

Referring to FIG. 2, the flash memory material measuring apparatus 100 according to an embodiment may include an ONOA current measuring circuit 110, a reliability indicator generator 120, and a material managing circuit 130.

The ONOA current measuring circuit 110 may apply the ONOA current measuring voltage to a selected word line SEL. WL coupled to a selected memory cell MC in a flash memory to measure the ONOA current.

Specifically, the ONOA current measuring circuit 110 may drive the drain select transistor DST and the source select transistor SST in the memory cell array of the flash memory of FIG. 1 to select the memory cell string CS including the selected memory cell. The ONOA current measuring circuit 110 may apply a zero (0) voltage to a selected bit line BL and a selected source line SL coupled to the selected memory cell. The ONOA current measuring circuit 110 may apply the ONOA current measuring voltage to the selected word line SEL. WL coupled to the selected memory cell. The ONOA current measuring circuit 110 may apply a pass voltage Vpass to unselected word lines UNSEL. WL while the ONOA current measuring voltage is applied to the selected word line SEL. WL, and apply the zero (0) voltage to the unselected word lines UNSEL, WL while the zero (0) voltage is applied to the selected word line SEL. WL.

To apply corresponding voltages to the word lines WL, the bit bines BL, and the source line SL of the memory cell array as described above, the ONOA current measuring circuit 110 may be configured as shown in FIG. 3. The ONOA current measuring circuit 110 may include a memory cell string selector 111, a bit line controller 113, a source line controller 115, a word line controller 117, and an ONOA current measurer 119.

The memory cell string selector 111 may be configured to drive the drain select transistor DST and the source select transistor SST of a memory cell string CS including a selected memory cell to select the memory cell string CS including the selected memory cell, as the selected memory cell string, among the plurality of memory cell strings in the memory cell array.

The bit line controller 113 may be configured to apply the zero (0) voltage to a bit line BL coupled to the selected memory cell string when the selected memory cell string is selected.

The source line controller 115 may be configured to apply the zero (0) voltage to the source line SL of the memory cell array when the selected memory cell string is selected.

Figure 4:
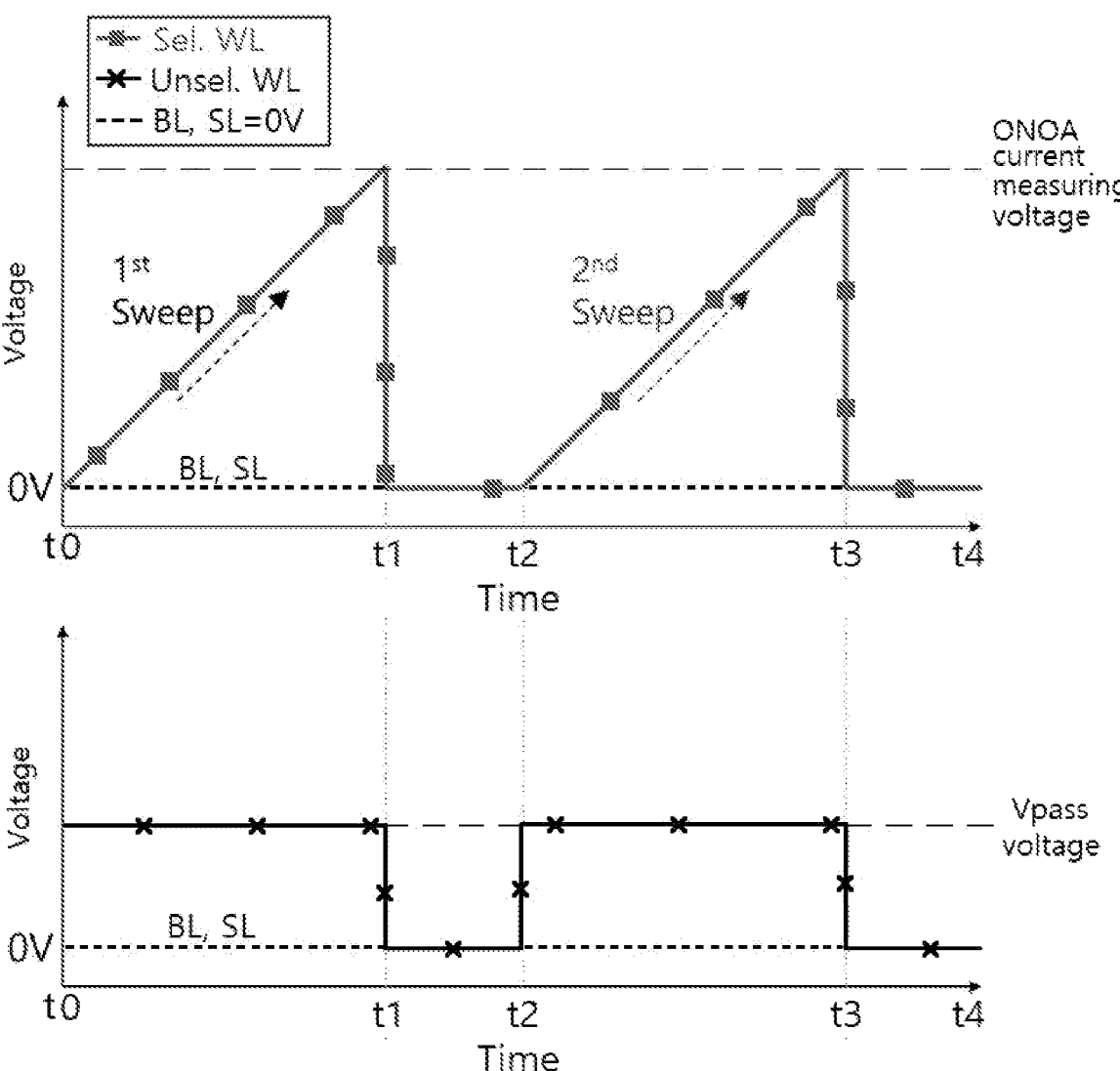
FIG. 4 is a graph illustrating an ONOA current measuring voltage (positive (+) bias) applied to a word line by a word line controller in a flash memory material reliability measuring apparatus through current measurement according to an embodiment of the present disclosure.

FIG. 4 is a graph illustrating an ONOA current measuring voltage (positive (+) bias) applied to the selected word line SEL. WL through a word line controller in the flash memory material reliability measuring apparatus 100 through current measurement according to an embodiment.

Referring to FIG. 4, when the selected memory cell CS including the selected word line SEL. WL is selected through the memory cell string selector 111, the word line controller 117 may be configured to apply the ONOA current measuring voltage to the selected word line SEL. WL coupled to a gate of the selected memory cell MC among the memory cells arranged in series in the selected memory cell string (t0~t1, t2~t3) and apply the pass voltage Vpass to unselected word lines WL coupled to gates of unselected memory cells among the memory cells arranged in series in the selected memory cell string (t0~t1, t2~t3).

For example, when a corresponding memory cell string CS including the selected memory cell among the plurality of memory cell strings CS1 and CS2 is selected as the selected memory cell through the memory cell string selector 111, the bit line controller 113 and the source line controller 115 may apply the zero (0) voltage to a selected bit line BL and a selected source line SL coupled to the selected memory cell string CS, respectively (t0~t4). The word line controller 117 may apply the ONOA current measuring voltage to the selected word line SEL. WL, and thus the ONOA current measuring voltage may be applied to the gate of the selected memory cell MC (t0~t1, t2~t3). Referring to FIG. 4, through the above-described processing, the word line controller 117 may control the pass voltage Vpass to be applied to the unselected word lines UNSEL. WL while the ONOA current measuring voltage is applied to the selected word line SEL. WL (t0~t1, t2~t3), and control the zero (0) voltage to be applied to the unselected word lines UNSEL. WL while the zero (0) voltage is applied to the selected word line SEL. WL (t1~t2, t3~t4). The word line controller 117 may apply the ONOA current measuring voltage to the selected word line SEL. WL through a plurality of sweep processes, each of which increases the ONOA current measuring voltage to a FN tunneling threshold voltage for one period (t0~t1, t2~t3) and then maintains the ONOA current measuring voltage to the zero (0) voltage for a fixed time (t1~t2, t3~t4). The word line controller 117 may apply the ONOA current measuring voltage to the selected word line SEL. WL through a plurality of sweep processes. In each of the plurality of sweep processes, the word line controller 117 may apply the ONOA current measuring voltage, which is increased to a FN tunneling threshold voltage for a fixed time (sweep period, t0~t1, t2~t3) during each sweep process (t0~t2, t2~t4) and then is maintained to the zero (0) voltage for a remaining time (maintenance period, t1~t2, t3~t4) during each sweep process (t0~t2, t2~t4), to the selected word line SEL. WL.

Figure 5:
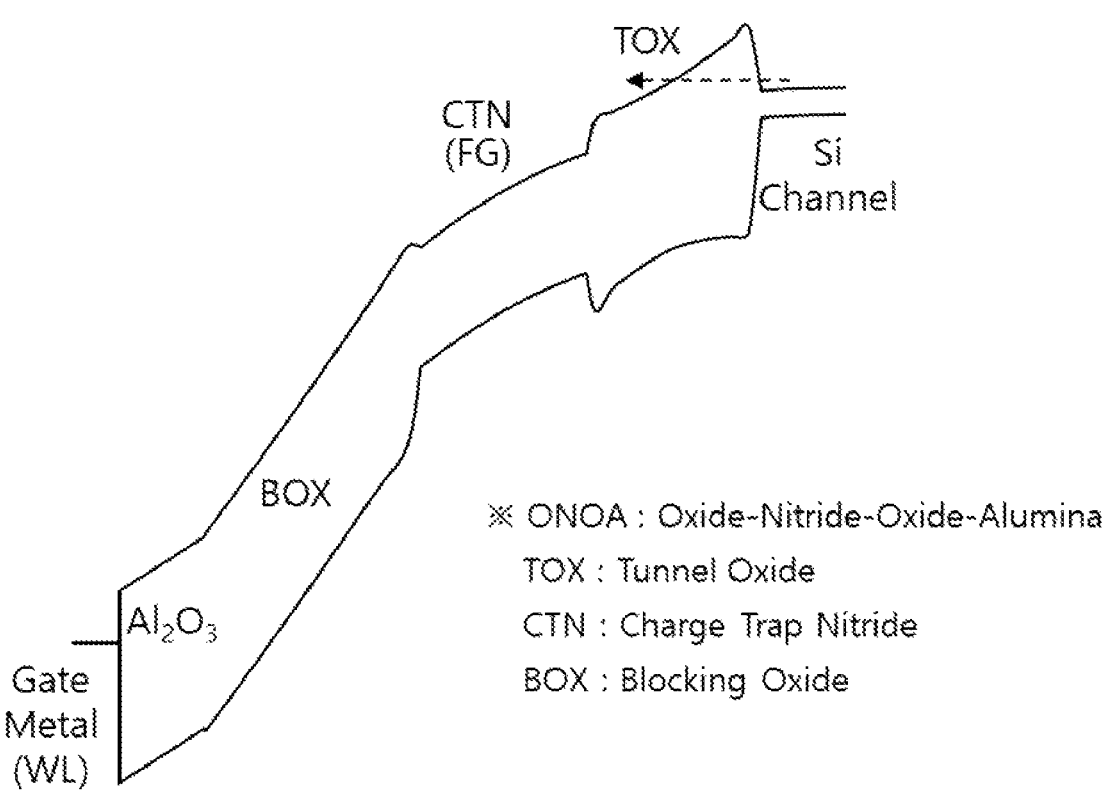
FIG. 5 is a diagram illustrating an energy band diagram of an ONOA current path when an ONOA current measuring voltage (positive (+) bias) is applied to a word line in a flash memory material reliability measuring apparatus through current measurement according to an embodiment of the present disclosure.

FIG. 5 is an energy band diagram of an ONOA path when an ONOA current measuring voltage (positive (+) bias) is applied to a word line WL in a flash memory material reliability measuring apparatus through current measurement according to an embodiment.

As shown in FIG. 5, when the ONOA current measuring voltage is applied to the gate of the selected memory cell MC, a potential barrier, which descends along with an ONOA path via a TOX layer, a floating gate FG, a CTN layer, a BOX layer, and an aluminum oxide ($Al_2O_3$) layer of the selected memory cell, may be formed from a Si channel of the selected memory cell toward a gate metal of the selected memory cell. Accordingly, the ONOA current may flow along the ONOA path between the Si channel and the gate metal by FN tunneling.

Characteristics of a dielectric layer such as an effective mass or a barrier height may be reflected in the ONOA current.

Referring back to FIG. 4, the word line controller 117 may be configured to apply the ONOA current measuring voltage to the selected word line SEL. WL coupled to the gate of the selected memory cell MC in each of the plurality of sweep processes. Each of the plurality of sweep processes may be divided into a sweep period which increases the ONOA current measuring voltage to the FN tunneling threshold voltage and a maintenance period which maintains the ONOA current measuring voltage to the zero (0) voltage.

In each of the plurality of sweep processes, the ONOA current measuring voltage may be increased to the FN tunneling threshold voltage for a fixed time (sweep period) and then maintained to the zero (0) voltage for a remaining time (maintenance period) after the sweep period. The ONOA current measuring circuit 110 may be configured to measure the ONOA current in the sweep period, in which the ONOA current measuring voltage is applied, in a second sweep process ($2^{nd}$ Sweep). One sweep process includes one sweep period and one maintenance period. The 1st sweep process includes one sweep period (t0~t1) and one maintenance period (t1~t2). The 2nd sweep process includes one sweep period (t2~t3) performed after the maintenance period (t1~t2) of the 1st sweep process and one maintenance period (t3~t4).

The ONOA current measurer 119 may be configured to measure the ONOA current flowing in a path (for example, ONOA path) via the tunneling insulating layer of the selected memory cell to which the ONOA current measuring voltage is applied through the word line controller 117. The ONOA current measurer 119 may be configured to measure the ONOA current flowing through the ONOA path of the selected memory cell, to which the ONOA current measuring voltage is applied, in any one sweep process, other than a first sweep process ($1^{st}$ Sweep), among the plurality of the sweep processes. In an example, the ONOA current measurer 119 may be configured to measure the ONOA current flowing through the ONOA path when the ONOA current measuring voltage is applied to the selected word line SEL. WL through the word line controller 117 in the second sweep process among the plurality of sweep processes. In another example, the ONOA current measurer 119 may be configured to measure the ONOA current flowing through the ONOA path when the ONOA current measuring voltage is applied to the selected word line SEL. WL through the word line controller 117 in any one sweep process selected from remaining sweep processes, after the second sweep process, among the plurality of sweep processes.

The flash memory material reliability measuring apparatus 100 according to an embodiment may measure the ONOA current by applying the ONOA current measuring voltage (positive (+) bias) to the selected word line in a first sweep period of the first sweep process $1^{st}$ Sweep through the word line controller 117, and measure the ONOA current by applying the ONOA current measuring voltage (positive (+) bias) to the selected word line in a second sweep period of the second sweep process $2^{nd}$ Sweep through the word line controller 117, as shown in FIG. 4.

When the ONOA current measuring voltage is applied to the selected word line SEL. WL through the first sweep process $1^{st}$ Sweep, the CTN layer, which is the charge trap site in the ONOA structure, or a floating gate FG may be filled with electrons or holes. Then, when the ONOA current measuring voltage is applied to the selected word line SEL. WL through the second sweep process $2^{nd}$ Sweep, the current flowing through the ONOA path in the second sweep process may be reduced than the current flowing through the ONOA path in the first sweep process even when the same bias voltage as the bias voltage in the first sweep process is applied to the selected word line SEL. WL in the second sweep process.

Specifically, when the ONOA current measuring voltage, which is increased to the FN tunneling threshold voltage, is applied to the selected word line SEL. WL through the word line controller 117 in the first sweep period of the first sweep process $1^{st}$ Sweep, the CTN layer, which is a trap site in the ONOA structure, may be filled with charges (electrons or holes). Therefore, the ONOA current measured through the ONOA current measurer 119 might not match the FN current. On the other hand, when the ONOA current measuring voltage, which is increased to the FN tunneling threshold voltage, is applied to the selected word line SEL. WL through the word line controller 117 in the second sweep period of the second sweep process $2^{nd}$ Sweep, the CTN layer, which is a trap site in the ONOA structure, may have been filled with charges (electrons or holes), and thus ONOA current measured through the ONOA current measurer 119 may be reduced and may substantially match the FN current. The FN current may be calculated using the following General Equations 1 to 3.

$$\ln\left(\frac{J_{FN}}{E_{ox}^2}\right) = \ln(A) - \frac{B}{E_{ox}} \qquad \text{[General equation 1]}$$

$$A = \frac{q^3}{8\pi h \Phi_B m_{ox}^*} \qquad \text{[General equation 2]}$$

$$B = \frac{8\pi\sqrt{2m_{ox}^* \Phi_B^3}}{3qh} \qquad \text{[General equation 3]}$$

In General Equations 1 to 3, '$J_{FN}$' may refer to a FN current density, '$E_{OX}$' may refer to an electric field applied to a tunnel oxide (TOX) layer, '$m*_{ox}$' may refer to an effective mass in a dielectric, '$\Phi_B$' may refer to a barrier height, that is a work function, 'H' may refer to a Flank constant, and 'q' may refer to charge quantity.

Accordingly, it can be seen that when the ONOA current is measured by applying the ONOA current measuring voltage to the selected word line SEL. WL through the second sweep process $2^{nd}$ Sweep and the FN current is calculated through General Equations 1 to 3, the actually measured ONOA current matches the FN current. Therefore, the flash memory material reliability measuring apparatus 100 according to an embodiment may measure the ONOA current in the second sweep process after the first sweep process is performed and then apply the measured ONOA current to generate the reliability indicator for a material of the flash memory.

Further, the flash memory material reliability measuring apparatus 100 according to an embodiment may measure the ONOA currents and the FN current through first to fourth sweep processes in which the ONOA current measuring voltage (positive (+) bias) is applied to the selected word line SEL. WL through the word line controller 117.

Specifically, when the ONOA current measuring voltage is first applied to the selected word line SEL. WL through the first sweep process $1^{st}$ Sweep, the CTN layer, which is a charge trap site in the ONOA structure, may be filled with charges. Accordingly, it may be illustrated that all the ONOA currents measured in the second sweep process $2^{nd}$ Sweep to the last sweep process (for example, fourth sweep process) may be almost the same as each other. At this time, the ONOA currents measured in the second sweep process $2^{nd}$ Sweep to the last sweep process (for example, fourth sweep process) may substantially match the FN current.

Therefore, according to an embodiment, the ONOA currents, which are measured by applying the ONOA current measuring voltage to the selected word line SEL. WL from the second sweep process to the last sweep process after the ONOA current measuring voltage is applied to the selected word line SEL. WL in the first sweep, may be applied to generate the flash memory material reliability indicator. Specifically, the ONOA current may be measured by applying the ONOA current measuring voltage to the selected memory cell in any one sweep process, other than the first sweep process, among the plurality of sweep processes and the measured ONOA current may be applied to generate the flash memory material reliability indicator. In an example, the ONOA current may be measured in the second sweep process among the plurality of sweep processes and the measured ONOA current may be applied to generate the flash memory material reliability indicator, as described above. In another example, the ONOA current may be measured in any one sweep process selected from remaining sweep processes, after the second sweep process, among the plurality of sweep processes and the measured ONOA current may be applied to generate the flash memory material reliability indicator.

Referring back to FIG. 2, the reliability indicator generator 120 may be configured to generate the reliability indicator (i.e., reliability indicator signal) using the ONOA current measured in the ONOA current measuring circuit 110. The reliability indicator may include at least one of an endurance indicator, a retention indicator, a disturbance indicator, an interference indicator, and a tunnel oxide (TOX) nitrogen gradient indicator of the flash memory.

The endurance may refer to a maximum number of cycles to measure how many times the material of the flash memory can endure program and erase cycles.

The retention may refer to a time that the charges charged in the floating gate (in the CTN layer) can be retained. When a thickness of the TOX layer is thick, it is difficult to perform a program operation and it is easy to perform an erase operation compared to when the TOX layer is thin. When the thickness of the TOX layer is thin, it is difficult to perform an erase operation and it is easy to perform a program operation compared to when the TOX layer is thick. Accordingly, the retention may be used to calculate an item such as the thickness of the TOX layer. Specifically, values of the retention for each thickness of the TOX layer are calculated to generate standard information, and the thickness of the TOX layer can be calculated by comparing the unknown values of retention using the generated standard information.

The disturbance may refer to a phenomenon that charges (electrons or holes) are physically charged or discharged in an adjacent victim cell during programming, and thus a threshold voltage Vth of a memory cell is increased or reduced. That is, the charges may be charged or discharged into an adjacent floating gate, and thus the charge quantity of the adjacent floating gate may be physically changed.

The reason for the disturbance may be dielectric breakdown due to damage of a TOX layer, electrons trapped between a substrate and the TOX layer, charges such as electrons or holes trapped in the TOX layer, and the like.

The disturbance may include program disturbance in a word line direction, pass voltage disturbance in a bit line direction, pass voltage disturbance due to incremental step pulse program (ISPP), pass voltage disturbance due to increase in the number of memory cells of a memory cell string CS, read disturbance, disturbance due to a boosting method, and the like.

The program disturbance in the word line direction may occur due to accumulation of charges charged in the floating gates of the unselected memory cells in programming.

The pass voltage disturbance in the bit line direction may occur in all memory cells surrounding a floating gate to be programming in program driving.

The pass voltage disturbance due to the ISPP may occur due to a potential difference affecting the floating gate between a control gate of a pass transistor pass Tr and a substrate.

The pass voltage disturbance according to the increase in the number of memory cells of the memory cell string CS may occur due to increase in the threshold voltage Vth of the pass transistor pass Tr up to the level sufficient to affect the channel of the pass transistor pass Tr by repetitive application of the pass voltage according to increase in the number of memory cells coupled to the memory cell string CS in programming.

The read disturbance may occur due to charges unintentionally charged in an adjacent victim floating gate Victim VG in a data read process.

The disturbance due to the boosting method may occur due to charges such as electrons or holes charged in the adjacent floating gate FG charged by the voltage level applied to the substrate in boosting.

The interference may be a phenomenon in which the threshold voltage Vth of a target memory cell is shifted temporarily or for a fixed time as if the floating gate FG of the target memory cell is charged or discharged despite no substantial change in the number of charges in the floating gate FG. The reason of the interference may include parasitic capacitance generated between the target memory cell and surrounding memory cells, change in charge quantity of the surrounding floating gates, charges trapped around the floating gate FG, and the like.

The interference may include cell to cell interference (CCI), interference due to a program order, bit line to bit line interference (BBI), interference due to crack of the floating gate, vertical interference, horizontal interference, and the like.

The cell to cell interference (CCI) may occur due to increase of capacitance between floating gates FGs by reduction in a width between memory cells according to increase in density of memory cells.

The interference by the program order may occur due to a physical effect between bit lines according to the program order of sites three-dimensionally existing around one floating gate FG or between the floating gates FGs by the program order according to a program method.

The interference by the crack of the floating gate FG may refer to an effect on adjacent memory cells due to spreading of wave energy to the outside of the crack of the floating gate FG even though charges do not escape from the floating gate FG when the crack occurs in the floating gate FG.

The vertical interference may refer to change of the threshold voltages Vth in verification and read of a target memory cell by the memory cells in a cell string direction.

The horizontal interference may refer to change of the threshold voltages Vth in verification and read by the memory cells in a page direction.

The flash memory material reliability measuring apparatus 100 according to an embodiment may generate the reliability indicator for the flash memory material using the measured ONOA current.

Specifically, flash memory material reliability measuring apparatus 100 may derive the TOX electric field from the ONOA current and confirm reliability distribution according to the TOX electric field to generate an endurance reliability indicator (reliability indicator 1). In this way, the endurance according to the TOX electric field may be predicted by measuring the ONOA current and deriving the TOX electric field from the measured ONOA current. The TOX electric field may be a value calculated by an equation. The equation for calculating the TOX electric field may be ((ONOA BV) (Knee BV))/(ONOA BV)) in the second sweep process $2^{nd}$ Sweep. Here, 'ONOA BV' may refer to an ONOA breakdown voltage (BV), and 'Knee BV' may refer to an ONOA threshold voltage.

Further, the flash memory material reliability measuring apparatus 100 according to an embodiment may confirm a nitrogen gradient distribution in the tunneling oxide (TOX) layer according to the measured ONOA current to generate a TOX nitrogen gradient reliability indicator (reliability indicator 2).

Specifically, the flash memory material reliability measuring apparatus 100 according to an embodiment may generate the TOX nitrogen gradient reliability indicator (reliability indicator 2) by deriving the tunnel oxide (TOX) nitrogen gradient from the FN current.

The reliability indicator 2 may refer to a gradient of the FN current in the second sweep process $2^{nd}$ Sweep. The gradient value may be calculated by deriving the FN current by General Equations 1 to 3 and changing the X-axis to 1/V and the Y-axis to Ln $(1/V_2)$. Here, 'V' may refer to a FN current measuring voltage WL Bias(V).

Accordingly, the flash memory material reliability measuring apparatus 100 according to an embodiment may predict the nitrogen gradient of the TOX layer constituting the memory cell MC by measuring the ONOA current, as described above, during a semiconductor manufacturing process.

Referring back to FIG. 2, the material managing circuit 130 may be configured to reflect the reliability indicators generated in the reliability indicator generator 120 to the materials, perform screening to the materials to exclude the materials or perform grading to the materials to assign grades to the materials, and output a material management result (i.e., material management result signal) according to screening or grading.

The above-described flash memory material reliability measuring apparatus 100 according to an embodiment may output at least one or more reliability indicators among the reliability indicators including endurance, retention, disturbance, interference, and a TOX nitrogen gradient generated by the measured ONOA current, and the material management result.

Figure 6:
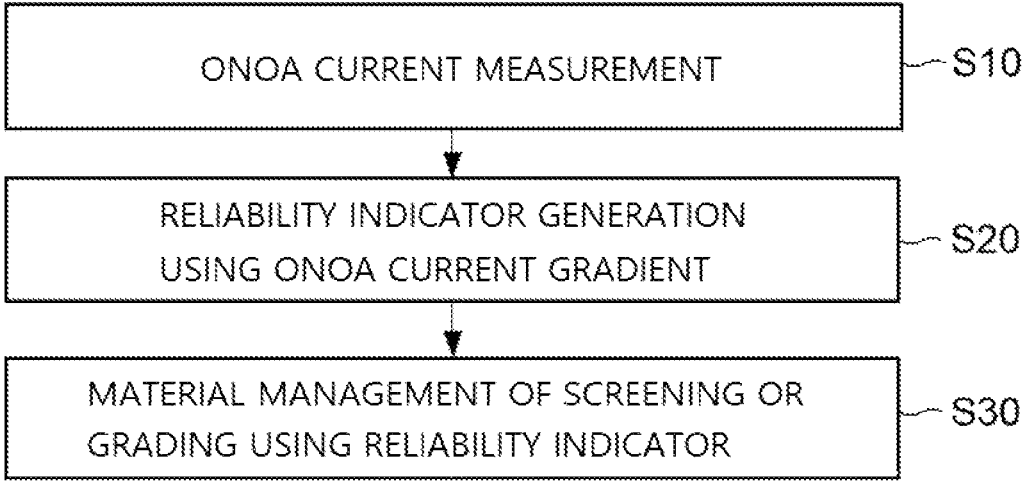
FIG. 6 is a flowchart illustrating a method of measuring flash memory material reliability according to an embodiment of the present disclosure.

FIG. 6 is a flowchart explaining a method of measuring flash memory material reliability according to an embodiment.

Referring to FIG. 6, the flash memory material reliability measuring method according to an embodiment may include measuring an ONOA current (S10), generating a reliability indicator (S20), and managing a material (S30), which are performed by the flash memory material reliability measuring apparatus 100 including the ONOA current measuring circuit 110, the reliability indicator generator 120, and the material managing circuit 130.

First, the measuring of the ONOA current (S10) may include measuring the ONOA current by applying an ONOA current measuring voltage to a selected word line SEL. WL of a selected memory cell MC in a flash memory through the ONOA current measuring circuit 110.

The measuring of the ONOA current (S10) may include selecting a memory cell string CS including the selected memory cell as an ONOA current measuring target in a memory cell array of the flash memory, applying a zero (0) voltage to a selected bit line BL and a selected source line SL coupled to the selected memory cell, applying a pass voltage Vpass to unselected word lines, applying a ONOA current measuring voltage to the selected word line SEL. WL, and measuring the ONOA current.

Specifically, in the measuring of the ONOA current (S10), the ONOA current measuring circuit 110 may control the memory cell string selector 111 to drive the drain select transistor DST and the source select transistor SST of the memory cell string CS including the selected memory cell and to select the memory cell string CS including the selected memory cell, as the selected memory cell string.

Further, in the measuring of the ONOA current (S10), the ONOA current measuring circuit 110 may control the bit line controller 113 to apply the zero (0) voltage to the bit line coupled to the selected memory cell string CS after the selected memory cell string CS is selected.

Further, in the measuring of the ONOA current (S10), the ONOA current measuring circuit 110 may control the source line controller 113 to apply the zero (0) voltage to the source line of the memory cell array after the selected memory cell string CS is selected.

Further, in the measuring of the ONOA current (S10), the ONOA current measuring circuit 110 may control the word line controller 117 to apply the ONOA current measuring voltage to the selected word line SEL. WL, thereby applying the ONOA current measuring voltage to a gate of the selected memory cell MC. In the process, the word line controller 117 may control the pass voltage to be applied to the unselected word lines UNSEL. WL while the ONOA current measuring voltage is applied to the selected word line SEL. WL, and control the zero (0) voltage to be applied to the unselected word line UNSEL. WL while the zero (0) voltage is applied to the selected word line SEL. WL. The ONOA current measuring voltage applied by the word line controller 117 may be applied through a plurality of sweep processes, each of which increases the ONOA current measuring voltage to the FN tunneling threshold voltage in the sweep period and then maintain the ONOA current measuring voltage to the zero (0) voltage in the maintenance period.

Further, in the measuring of the ONOA current (S10), the ONOA current measuring circuit 110 may control the ONOA current measurer 119 to measure the ONOA current flowing in a path (for example, ONOA path) via a floating gate (a tunneling insulating layer) of the selected memory cell to which the ONOA current measuring voltage is applied by the word line controller 117.

Further, in the measuring of the ONOA current (S10), the ONOA current measuring circuit 110 may control the ONOA current measurer 119 to measure the ONOA current of the selected memory cell after the ONOA current measuring voltage is applied to the selected word line SEL. WL in any one sweep period selected from the remaining sweep processes, other than the first sweep period, among the plurality of sweep processes.

Next, the generating of the reliability indicator (S20) may include generating the reliability indicator, by the reliability indicator generator 120, using the ONOA current measured in the ONOA current measuring circuit 110.

The reliability indicator generated using the ONOA current in the generating of the reliability indicators (S20) may include at least one or more reliability indicators among endurance, retention, disturbance, interference, and a TOX nitrogen gradient of the flash memory.

The managing of the materials (S30) may include, by the material managing circuit 130, applying the reliability indicator generated in the reliability indicator generator 120 to the material of the flash memory, performing screening on the material to exclude the material or performing grading on the material to assign the grade to the material, and outputting a material management result according to the screening or the grading.

Figure 7:
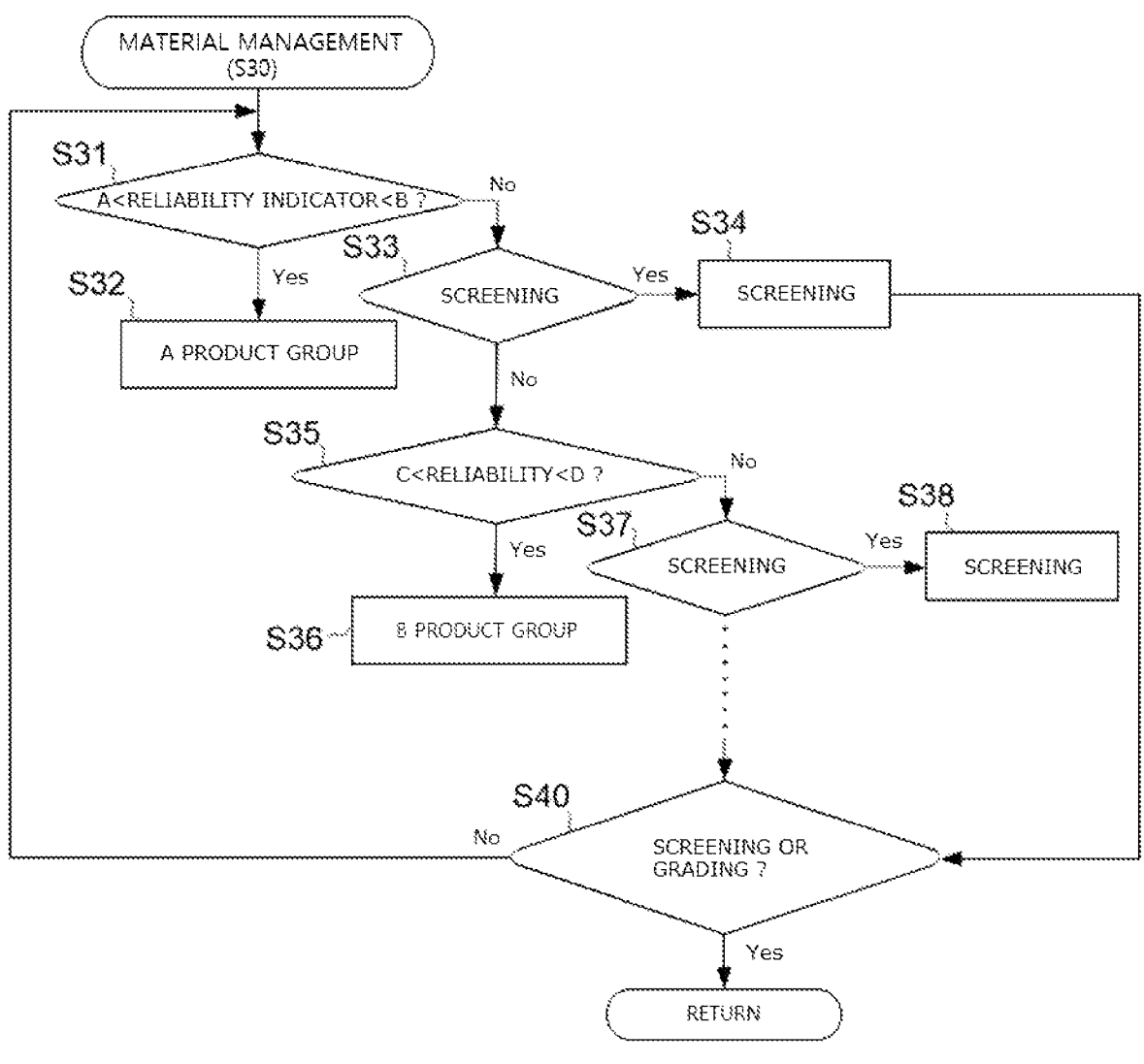
FIG. 7 is a flowchart illustrating a process of managing materials in a method of measuring flash memory material reliability according to an embodiment of the present disclosure.

FIG. 7 is a flowchart explaining a process of managing a material in a flash memory material reliability measuring method according to an embodiment.

As shown in FIG. 7, the managing of the material (S30) may include selecting one reliability indicator and performing material management, which classifies a product group through grading for the material or performs screening on the material, based on the selected reliability indicator.

Specifically, in the managing of the material (S30), the material managing circuit 130 may select the specific reliability indicator for the flash memory material as the derived reliability indicator target. The material managing circuit 130 may determine whether or not the selected reliability indicator is included in a reliability indicator reference value range (value of from a to b) for classifying the target flash memory material into an A product group (S31). The material managing circuit 130 may perform grading which classifies the corresponding flash memory material into the A product group when the selected reliability indicator is included in the reliability indicator reference value range (value of from a to b) for classifying the target flash memory material into the A product group (S32). The material managing circuit 130 may determine whether or not to perform screening on the corresponding flash memory material when the selected reliability indicator is not included in the reliability indicator reference value range (value of from a to b) for classifying the corresponding flash memory material into the A product group (S33). Then, the material managing circuit 130 may perform screening on the corresponding flash memory material when the corresponding flash memory material is a screening target as the screening determination result in S33. The material managing circuit 130 may determine whether or not the selected reliability indicator is included in a reliability indicator value range (value of from c to d) for classifying the corresponding flash memory material into a B product group (S35) when the corresponding flash memory material is a screening target as the screening determination result in S33 (S35). And the material managing circuit 130 may determine whether or performing additional screening again if the reliability indicator selected for the flash memory material in step 35 is not included in the range (value of from c to d) the reliability indicator value classified as product group B (S37). And, if the flash memory material is determined to be subject to additional screening in step 37, the material managing circuit 130 may control to perform additional screening on the flash memory material (S38). Then, the material managing circuit 130 may determine whether to perform screening or end grading if the flash memory material is not subject to additional screening as a result of determining whether to screen in step 37 (S40). The material managing circuit 130 may perform the material management by repeatedly performing grading or screening on the corresponding flash memory material according to the product group of the corresponding flash memory material through the above-described process.

The flash memory material reliability measuring method according to an embodiment may be provided as a recording medium in which codes, which are readable and executable by a computer, are stored.

The above described embodiments of the present disclosure are intended to illustrate and not to limit the present disclosure. Various alternatives and equivalents are possible.

The embodiments are not limited by the embodiments described herein. Nor are the embodiments limited to any specific type of semiconductor device. Other additions, subtractions, or modifications are possible in view of the present disclosure and are intended to fall within the scope of the appended claims.

What is claimed is:

1. A flash memory material reliability measuring apparatus using current measurement comprising:

an oxide-nitride-oxide-alumina (ONOA) current measuring circuit configured to measure an ONOA current by applying a ONOA current measuring voltage to a selected word line coupled to a selected memory cell in a flash memory; and a reliability indicator generator configured to generate a reliability indicator using the ONOA current measured through the ONOA current measuring circuit, wherein the reliability indicator generated in the reliability indicator generator includes at least one of an endurance indicator, a retention indicator, a disturbance indicator, an interference indicator, and a tunnel oxide (TOX) nitrogen gradient indicator of the flash memory.

2. The apparatus of claim 1, wherein the ONOA current measuring circuit selects a memory cell string including the selected memory cell, as an ONOA current measuring target, from a memory cell array of the flash memory, applies a zero (0) voltage to a selected bit line and a selected source line coupled to the selected memory cell, applies a pass voltage to unselected word lines, applies an ONOA current measuring voltage to a selected word line coupled to the selected memory cell, and measures the ONOA current.

3. The apparatus of claim 1, wherein the ONOA current measuring circuit applies the ONOA current measuring voltage applied to the selected word line coupled to the selected memory cell through a plurality of sweep processes, one of the plurality of sweep processes includes a sweep period in which the ONOA current measurement voltage is applied for a fixed time to rise to the Fowler-Nordheim (FN) tunneling threshold voltage, and a maintenance period in which the ONOA current measurement voltage is maintained at for a fixed time after the sweep period.

4. The apparatus of claim 3, wherein the ONOA current measuring circuit measures the ONOA current during the sweep period.

5. The apparatus of claim 4, wherein the ONOA current measuring circuit measures the ONOA current during a sweep period included in one sweep process selected from among the sweep processes excluding the first sweep process among the plurality of sweep processes.

6. The apparatus of claim 3, wherein the ONOA current measuring circuit applies a pass voltage to the unselected word line during the sweep period and applies 0V to the unselected word line during the maintenance period.

7. The apparatus of claim 1, further comprising a material managing circuit configured to apply the reliability indicator generated in the reliability indicator generator to a material of the flash memory, perform screening on the material to exclude the material of the flash memory or grading on the material to assign a grade to the material, and output a material management result according to the screening or grading.

8. A method of measuring reliability of a material of a flash memory using a flash memory material reliability measuring apparatus, which includes an Oxide-Nitride-Oxide-Alumina (ONOA) current measuring circuit, a reliability indicator generator, and a material managing circuit, the method comprising:

the ONOA current measuring circuit measuring an ONOA current via a tunnel insulating layer through Fowler-Nordheim (FN) tunneling by applying an ONOA current measuring voltage to a selected word line coupled to a selected memory cell of the flash memory; and the reliability indicator generator generating a reliability indicator using the ONOA current measured in the ONOA current measuring circuit, wherein the reliability indicator generated in the reliability indicator generator includes at least one of an endurance indicator, a retention indicator, a disturbance indicator, an interference indicator, and a tunnel oxide (TOX) nitrogen gradient indicator of the flash memory.

9. The method of claim 8, wherein the measuring of the ONOA current includes: by the ONOA current measuring circuit, selecting a memory cell string including the selected memory cell, as an ONOA current measuring target, from a plurality of cell strings in a memory cell array of the flash memory;

applying a zero (0) voltage to a selected bit line and a selected source line coupled to the selected memory cell;

applying a pass voltage to unselected word lines;

applying the ONOA current measuring voltage to the selected word line; and measuring the ONOA current.

10. The method of claim 8, wherein in the measuring of the ONOA current includes applying an ONOA current measuring voltage to a selected word line coupled to the selected memory cell through a plurality of sweep processes, wherein the plurality of sweep processes perform one sweep process multiple times, wherein the one sweep process includes a sweep period in which the ONOA current measurement voltage is applied for a fixed time to rise to the Fowler-Nordheim (FN) tunneling threshold voltage, and a maintenance period in which the ONOA current measurement voltage is maintained at 0V for a fixed time after the sweep period.

11. The method of claim 8, wherein the ONOA current measuring circuit measuring the ONOA current measures the ONOA current during a sweep period.

12. The method of claim 11, wherein ONOA current measuring circuit the measuring the ONOA current measures the ONOA current during the sweep period included in one sweep process selected from among sweep processes excluding the first sweep process among the plurality of sweep processes.

13. The method of claim 10, wherein the measuring of the ONOA current applies a pass voltage to the unselected word line during the sweep period and applies 0V to the unselected word line during the maintenance period.

14. The method of claim 8, further comprising managing, by the material managing circuit, applying the reliability indicator generated in the reliability indicator generator to a material of the flash memory, performing management on the material by screening on the material to exclude the material or by grading on the material to assign a grade for the material, and outputting a material management result according to the screening or grading.

15. A readable recording medium in which codes, which are read by a computer to execute the material reliability measuring method of claim 8, are recorded.

*     *     *     *     *